United States Patent
Nagai et al.

(10) Patent No.: US 8,390,392 B2
(45) Date of Patent: Mar. 5, 2013

(54) VARIABLE CAPACITANCE MODULE AND MATCHING CIRCUIT MODULE

(75) Inventors: Tomohiro Nagai, Nagaokakyo (JP); Ken Tonegawa, Nagaokakyo (JP); Tetsuro Harada, Nagaokakyo (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 13/246,989

(22) Filed: Sep. 28, 2011

(65) Prior Publication Data

US 2012/0062332 A1 Mar. 15, 2012

Related U.S. Application Data

(63) Continuation of application No. PCT/JP2010/055181, filed on Mar. 25, 2010.

(30) Foreign Application Priority Data

Mar. 30, 2009 (JP) .................................. 2009-082046

(51) Int. Cl.
*H03H 7/38* (2006.01)
(52) U.S. Cl. ......................................................... 333/32
(58) Field of Classification Search .................. 333/32, 333/33
See application file for complete search history.

(56) References Cited

U.S. PATENT DOCUMENTS

| 5,644,349 | A | 7/1997 | Martin |
| 6,556,416 | B2 * | 4/2003 | Kunihiro ..................... 361/277 |

FOREIGN PATENT DOCUMENTS

| EP | 1 343 189 A2 | 9/2003 |
| JP | 63-204806 A | 8/1988 |
| JP | 03-002624 U | 1/1991 |
| JP | 07-273547 A | 10/1995 |
| JP | 08-172030 A | 7/1996 |
| JP | 2003-258502 A | 9/2003 |
| JP | 2008-236386 A | 10/2008 |

OTHER PUBLICATIONS

Official Communication issued in International Patent Application No. PCT/JP2010/055181, mailed on Jun. 8, 2010.

* cited by examiner

*Primary Examiner* — Stephen Jones
(74) *Attorney, Agent, or Firm* — Keating & Bennett, LLP

(57) ABSTRACT

In a variable capacitance module capable of achieving necessary variable capacitance ranges, a variable capacitance circuit includes a variable capacitance element and fixed capacitance elements. A first variable capacitance element and a first fixed capacitance element are connected in series, and the series circuit thereof and a second fixed capacitance element are connected in parallel. Accordingly, with reference to the capacitance of the second fixed capacitance element, the range of the combined capacitance of the variable capacitance circuit is provided by a step size of capacitance based on the combined capacitance of the variable capacitance element and the first fixed capacitance element. The first and second fixed capacitance elements are defined by innerlayer flat-plate electrodes in a laminated substrate, and the variable capacitance element is defined by an MEMS element mounted on a top surface of the laminated substrate.

10 Claims, 6 Drawing Sheets

FIG. 3A

| Cv | Cse | Csh | Ct | ΔC |
|---|---|---|---|---|
| 0.5 | 10 | 6.67 | 7.15 | - |
| 1 | 10 | 6.67 | 7.58 | 0.43 |
| 1.5 | 10 | 6.67 | 7.97 | 0.40 |
| 2 | 10 | 6.67 | 8.34 | 0.36 |
| 2.5 | 10 | 6.67 | 8.67 | 0.33 |
| 3 | 10 | 6.67 | 8.98 | 0.31 |
| 3.5 | 10 | 6.67 | 9.26 | 0.28 |
| 4 | 10 | 6.67 | 9.53 | 0.26 |
| 4.5 | 10 | 6.67 | 9.77 | 0.25 |
| 5 | 10 | 6.67 | 10.00 | 0.23 |

FIG. 3B

| Cv | Cse | Csh | Ct | ΔC |
|---|---|---|---|---|
| 0.5 | 20 | 6 | 6.49 | - |
| 1 | 20 | 6 | 6.95 | 0.46 |
| 1.5 | 20 | 6 | 7.40 | 0.44 |
| 2 | 20 | 6 | 7.82 | 0.42 |
| 2.5 | 20 | 6 | 8.22 | 0.40 |
| 3 | 20 | 6 | 8.61 | 0.39 |
| 3.5 | 20 | 6 | 8.98 | 0.37 |
| 4 | 20 | 6 | 9.33 | 0.35 |
| 4.5 | 20 | 6 | 9.67 | 0.34 |
| 5 | 20 | 6 | 10.00 | 0.33 |

FIG. 3C

| Cv | Cse | Csh | Ct | ΔC |
|---|---|---|---|---|
| 0.5 | 40 | 5.45 | 5.94 | - |
| 1 | 40 | 5.45 | 6.43 | 0.48 |
| 1.5 | 40 | 5.45 | 6.90 | 0.47 |
| 2 | 40 | 5.45 | 7.35 | 0.46 |
| 2.5 | 40 | 5.45 | 7.80 | 0.45 |
| 3 | 40 | 5.45 | 8.24 | 0.44 |
| 3.5 | 40 | 5.45 | 8.67 | 0.43 |
| 4 | 40 | 5.45 | 9.09 | 0.42 |
| 4.5 | 40 | 5.45 | 9.49 | 0.41 |
| 5 | 40 | 5.45 | 9.89 | 0.40 |

FIG. 3D

| Cv | Cse | Csh | Ct | ΔC |
|---|---|---|---|---|
| 0.5 | 100 | 5.24 | 5.74 | - |
| 1 | 100 | 5.24 | 6.23 | 0.49 |
| 1.5 | 100 | 5.24 | 6.72 | 0.49 |
| 2 | 100 | 5.24 | 7.20 | 0.48 |
| 2.5 | 100 | 5.24 | 7.68 | 0.48 |
| 3 | 100 | 5.24 | 8.15 | 0.47 |
| 3.5 | 100 | 5.24 | 8.62 | 0.47 |
| 4 | 100 | 5.24 | 9.09 | 0.46 |
| 4.5 | 100 | 5.24 | 9.55 | 0.46 |
| 5 | 100 | 5.24 | 10.00 | 0.46 |

FIG. 3E

| Cv | Cse | Csh | Ct | ΔC |
|---|---|---|---|---|
| 0.5 | 40 | 15.56 | 16.05 | - |
| 1 | 40 | 15.56 | 16.54 | 0.48 |
| 1.5 | 40 | 15.56 | 17.01 | 0.47 |
| 2 | 40 | 15.56 | 17.46 | 0.46 |
| 2.5 | 40 | 15.56 | 17.91 | 0.45 |
| 3 | 40 | 15.56 | 18.35 | 0.44 |
| 3.5 | 40 | 15.56 | 18.78 | 0.43 |
| 4 | 40 | 15.56 | 19.20 | 0.42 |
| 4.5 | 40 | 15.56 | 19.60 | 0.41 |
| 5 | 40 | 15.56 | 20.00 | 0.40 |

FIG. 3F

| Cv | Cse | Csh | Ct | ΔC |
|---|---|---|---|---|
| 0.5 | 1 | 1.17 | 1.50 | - |
| 1 | 1 | 1.17 | 1.67 | 0.17 |
| 1.5 | 1 | 1.17 | 1.77 | 0.10 |
| 2 | 1 | 1.17 | 1.84 | 0.07 |
| 2.5 | 1 | 1.17 | 1.88 | 0.05 |
| 3 | 1 | 1.17 | 1.92 | 0.04 |
| 3.5 | 1 | 1.17 | 1.95 | 0.03 |
| 4 | 1 | 1.17 | 1.97 | 0.02 |
| 4.5 | 1 | 1.17 | 1.99 | 0.02 |
| 5 | 1 | 1.17 | 2.00 | 0.02 |

VARIABLE CAPACITANCE MODULE AND MATCHING CIRCUIT MODULE

BACKGROUND OF THE INVENTION

1. Field of the Invention

The present invention relates to a variable capacitance module that achieves a capacitance value of a predetermined width and a matching circuit module including the variable capacitance module.

2. Description of the Related Art

In the past, there have been disclosed various kinds of high-frequency modules, each of which transmits and receives, using one antenna, a plurality of communication signals utilizing frequency bands that are different from one another. In such a high-frequency module, for example, if matching is not performed between the antenna and a transmitting and receiving circuit, it is difficult to transmit and receive a communication signal with low loss. If a transmission and reception environment is stable, a capacitance value used for matching is theoretically fixed. However, for example, when the high-frequency module, such as a mobile phone, is easily movable or the orientation thereof can be easily changed, it is difficult to fully perform matching using the fixed capacitance. Therefore, for example, in an RFMEMS element described in Japanese Unexamined Patent Application Publication No. 2003-258502, a MEMS (Micro Electro Mechanical System) element is used as a capacitance element, a ground electrode and a movable electrode are arranged with electrode planes that face each other, and a minute interval is arbitrarily set between the ground electrode and the movable electrode, thereby achieving a desired variable capacitance value necessary for matching.

However, as described above, in the current high-frequency module, since the plurality of communication signals are transmitted and received using one antenna, it is necessary to make the capacitance value variable with respect to each communication signal. Therefore, a necessary variable capacitance range changes, and a capacitance range required for a high-frequency module becomes large. At this time, while a configuration is usually adopted in which a plurality of MEMS elements are provided and connected in parallel, the formation of the plurality of MEMS elements on a same substrate results in the size of the substrate being relatively large. In addition, as illustrated in Japanese Unexamined Patent Application Publication No. 2003-258502, since the MEMS elements are formed by a semiconductor manufacturing process, the substrate size is large, which results in a large cost increase. In addition, when the plurality of MEMS elements are provided on one substrate, a contribution component is generated and a problem occurs in that it is difficult to provide a variable capacitance in a wide frequency band.

SUMMARY OF THE INVENTION

To overcome the problems described above, preferred embodiments of the present invention provide a variable capacitance module in which the required variable capacitance ranges can be effectively and inexpensively obtained, and a matching circuit module in which matching can be effectively and reliably performed in the required impedance matching ranges using the variable capacitance module.

A variable capacitance module according to a preferred embodiment of the present invention preferably includes a variable capacitance element, a first fixed capacitance element, and a second fixed capacitance element. The variable capacitance element includes a predetermined variable capacitance width. The first fixed capacitance element is connected in series to the variable capacitance element and is mounted in a laminated substrate in which the variable capacitance element is mounted, or is defined by an inner-layer flat-plate electrode in the laminated substrate. The second fixed capacitance element is connected in parallel to a series circuit of the variable capacitance element and the first fixed capacitance element, and is mounted in the laminated substrate in which the variable capacitance element is mounted, or is defined by an inner-layer flat-plate electrode in the laminated substrate.

More specifically, in the variable capacitance module according to a preferred embodiment of the present invention, the variable capacitance element is preferably defined by an MEMS element, for example.

With this configuration, a variable capacitance circuit is defined by the variable capacitance element, the first fixed capacitance element, and the second fixed capacitance element. When it is assumed that the capacitance of the variable capacitance element is Cv, the capacitance of the first fixed capacitance element is C1, and the capacitance of the second fixed capacitance element is C2, a combined capacitance Cm as the variable capacitance circuit, i.e., as the variable capacitance module, satisfies the following expression.

$$Cm = \frac{Cv}{1 + \frac{Cv}{C1}} + C2 \qquad \text{Expression 1}$$

Accordingly, as compared to a case in which only the capacitance Cv of the variable capacitance element is used, the combined capacitance Cm of the variable capacitance module becomes diversified due to the combination of the first fixed capacitance element and the second fixed capacitance element. In addition, only the variable capacitance element is the MEMS element, and the first fixed capacitance element and the second fixed capacitance element are provided by a typical chip component in which no MEMS element is used or provided by the inner-layer flat-plate electrode provided in the laminated substrate. Therefore, as compared to a case in which the entire variable capacitance circuit is defined by a plurality of MEMS elements, the first fixed capacitance element and the second fixed capacitance element are much less expensive and no parasitic capacitance occurs.

In addition, in the variable capacitance element of the variable capacitance module according to a preferred embodiment of the present invention, the variable capacitance width thereof is preferably fixed. The second fixed capacitance element is set to a capacitance value that is based on a desired variable capacitance range for a module. The first fixed capacitance element is set to a capacitance value that determines a variable capacitance pitch desired for the module.

In this configuration, even if the number of the types of variable capacitance elements is one, the capacitances of the first fixed capacitance element and the second fixed capacitance element are arbitrarily set. Accordingly, it is possible to easily provide the variable capacitance range and the variable pitch required for the module.

In addition, the first fixed capacitance element and the second fixed capacitance element of the variable capacitance module preferably include an inner-layer flat-plate electrode that is shared by both of the first fixed capacitance element and the second fixed capacitance element.

With this configuration, as compared to a case in which the first fixed capacitance element and the second fixed capacitance element are individually provided, the inner-layer flat-plate electrode defining a connection end portion side on which the first and second fixed capacitance elements are connected are shared, and thus, the overall size of the variable capacitance element can be downsized. In addition, since there is no connection electrode pattern between the first fixed capacitance element and the second fixed capacitance element, a problem in that the connection electrode pattern is unnecessarily coupled with another electrode within the laminated substrate in a high-frequency manner is prevented, and it is possible to prevent characteristics from being degraded.

In addition, the first fixed capacitance element and the second fixed capacitance element of the variable capacitance module according to a preferred embodiment of the present invention are provided in a lower layer of an area in which the variable capacitance element is mounted in the laminated substrate.

With this configuration, individual elements of the variable capacitance module are arranged in the laminating direction of the laminated substrate, and are arranged with a high density when the laminated substrate is viewed in plan view. Therefore, further downsizing of the variable capacitance module is achieved. In addition, since it is possible to reduce the length of a connection electrode pattern connecting individual elements defining the variable capacitance modules, it is possible to prevent characteristics from degrading and the formation of the connection electrode pattern is much more easily achieved. Accordingly, a small-sized variable capacitance module having excellent characteristics and capable achieving a wide variety of variable capacitance ranges is provided.

In addition, a matching circuit module according to a preferred embodiment of the present invention preferably includes a variable capacitance module according to a preferred embodiment of the present invention and an inductor provided in the laminated substrate. In addition, an LC circuit network is preferably provided by connecting the variable capacitance module and the inductor using an electrode pattern provided in the laminated substrate.

With this configuration, the inductor is provided in the laminated substrate in which a variable capacitance module according to a preferred embodiment of the present invention is provided, and by connecting the variable capacitance module and the inductor to a predetermined circuit pattern, the matching circuit module is provided. At this time, since, in the variable capacitance module, it is possible to achieve a wide variety of variable capacitance ranges as described above, it is also possible to variably set the impedance matching range of the matching circuit module. Accordingly, a small-sized matching circuit module in which a wide variety of impedance matching ranges can be set is provided.

In addition, the matching circuit module according to a preferred embodiment of the present invention preferably includes an open stub connected to the LC circuit network defined by a stub-use electrode provided in the laminated substrate.

With this configuration, the open stub is preferably further connected to the LC circuit network, and thus, it is possible to significantly change an impedance matching range, in which matching can be performed in the LC circuit network, to an impedance matching range that is varied depending on the open stub. At this time, since a shift amount can be set by adjusting the line length of the open stub, it is possible to set a wider variety of impedance matching ranges. At this time, since the open stub includes the stub-use electrode provided in the laminated substrate, the size of the matching circuit module is not significantly increased. Thus, without significantly increasing the size of the matching circuit module, it is possible to achieve a matching circuit module in which impedance matching is performed within an even wider impedance matching range.

In addition, the matching circuit module according to a preferred embodiment of the present invention preferably includes, as the open stub, a plurality of open stubs in which electrode lengths of the stub-use electrodes are different from one another.

With this configuration, by providing the plurality of open stubs, it is possible to set a wider variety of impedance matching ranges.

In addition, in the matching circuit module according to a preferred embodiment of the present invention, a switch element is preferably provided between the LC circuit network and the open stub.

With this configuration, if the open stub is separated from the LC circuit network by the switch element, the impedance matching range of the independent LC circuit network is set. In addition, if the open stub is connected to the LC circuit network by the switch element, it is possible to greatly change the impedance matching range of the independent LC circuit network to an impedance matching range varying depending on the open stub. Accordingly, since two impedance matching ranges are set due to the on-off control of the switch element, it is possible to perform matching in an even wider impedance matching range.

In addition, in the matching circuit module according to a preferred embodiment of the present invention, an electrode length of the stub-use electrode is preferably set so that impedance matching ranges switched by the open stub do not overlap with each other.

With this configuration, it is possible to effectively increase the impedance matching range based on the switch element, such that impedance matching ranges based on the above-mentioned on-off control of the switch element do not overlap with each other.

In addition, the inductor of the matching circuit module according to a preferred embodiment of the present invention is preferably defined by an inductor-use electrode provided in the laminated substrate, and the inductor-use electrode and the stub-use electrode are preferably arranged so as not to overlap with each other when the laminated substrate is viewed in a plan view.

With this configuration, since the electrode plane of the inductor-use electrode and the electrode plane of the stub-use electrode do not face each other, the inductor and the open stub are not significantly coupled with each other in a high-frequency manner, and it is possible to easily design a circuit that achieves a desired impedance matching range.

In addition, in the matching circuit module according to a preferred embodiment of the present invention, the stub-use electrode and the inner-layer flat-plate electrode defining the first fixed capacitance element and the second fixed capacitance element are preferably arranged so as not to overlap with each other when the laminated substrate is viewed in a plan view.

According to this configuration, since the inner-layer flat-plate electrode defining the first fixed capacitance element and the second fixed capacitance element does not face the stub-use electrode, the first fixed capacitance element and the second fixed capacitance element are not significantly coupled with the open stub in a high-frequency manner, and it is possible to easily design a circuit that achieves a desired impedance matching range.

According to various preferred embodiments of the present invention, it is possible to effectively and inexpensively provide a variable capacitance module in which necessary variable capacitance ranges can be set. Furthermore, by using such a variable capacitance module, it is possible to effectively and inexpensively provide a matching circuit module having a small size, in which necessary impedance matching ranges can be set.

The above and other elements, features, steps, characteristics and advantages of the present invention will become more apparent from the following detailed description of the preferred embodiments with reference to the attached drawings.

BRIEF DESCRIPTION OF THE DRAWINGS

FIGS. 3A to 3F are diagrams illustrating characteristics of combined capacitance Ct and a step size ΔC of a capacitance in a variable capacitance circuit, due to various combinations of a variable capacitance element Cv, a series fixed capacitance element Cse series-connected to the corresponding variable capacitance element Cv, and a parallel fixed capacitance element Csh in parallel with a series circuit based on these variable capacitance element Cv and series fixed capacitance element Cse.

DETAILED DESCRIPTION OF THE PREFERRED EMBODIMENTS

A matching circuit module according to various preferred embodiments of the present invention will be described with reference to drawings.

Figure 1:
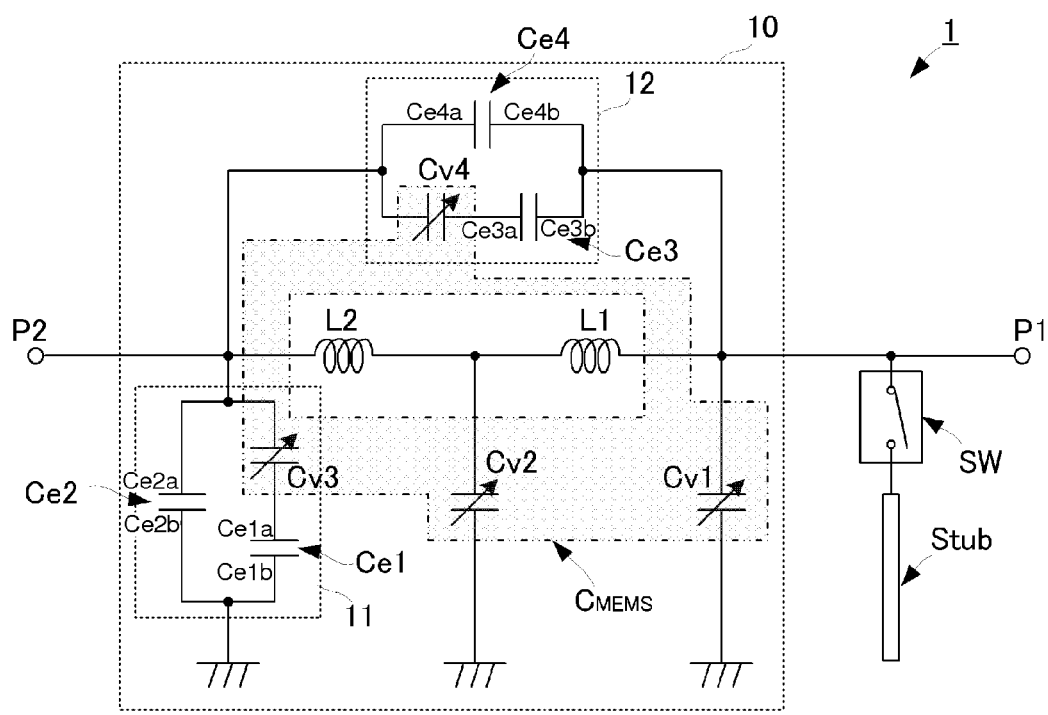
FIG. 1 is an equivalent circuit diagram of a matching circuit module according to a preferred embodiment of the present invention.

FIG. 1 is the equivalent circuit diagram of a matching circuit module 1 according to a preferred embodiment of the present invention. As illustrated in FIG. 1, the matching circuit module 1 of the present preferred embodiment preferably includes a first input-output port P1 and a second input-output port P2, and a circuit configuration including an LC circuit network 10 that is inserted between the first input-output port P1 and the second input-output port P2. One end portion of a switch element SW is preferably connected to an end portion on the first input-output port P1 side of the LC circuit network 10, and an open stub Stub is preferably connected to the other end portion of the switch SW.

The LC circuit network 10 preferably includes an inductor L1 and an inductor L2 that are connected in series between the first input-output port P1 and the second input-output port P2. At this time, a first input-output port P1 side is the inductor L1, and a second input-output port P2 side is the inductor L2.

A variable capacitance element Cv1 is connected between an end portion on the first input-output port P1 side of the inductor L1 and ground. A variable capacitance element Cv2 is connected between a connection point between the inductor L1 and the inductor L2 and the ground.

A variable capacitance circuit 11 defining a "variable capacitance module" according to a preferred embodiment of the present invention is preferably connected between an end portion on the second input-output port P2 side of the inductor L2 and the ground. In the variable capacitance circuit 11, a fixed capacitance element Ce2 (corresponding to a second fixed capacitance element) is connected in parallel to a series circuit including a fixed capacitance element Ce1 (corresponding to a first fixed capacitance element) and a variable capacitance element Cv3.

In addition, a variable capacitance circuit 12 is preferably connected in parallel to a series circuit including the inductors L1 and L2. In the variable capacitance circuit 12, a fixed capacitance element Ce4 (corresponding to the second fixed capacitance element) is connected in parallel to a series circuit including a fixed capacitance element Ce3 (corresponding to the first fixed capacitance element) and a variable capacitance element Cv4.

Figure 2:
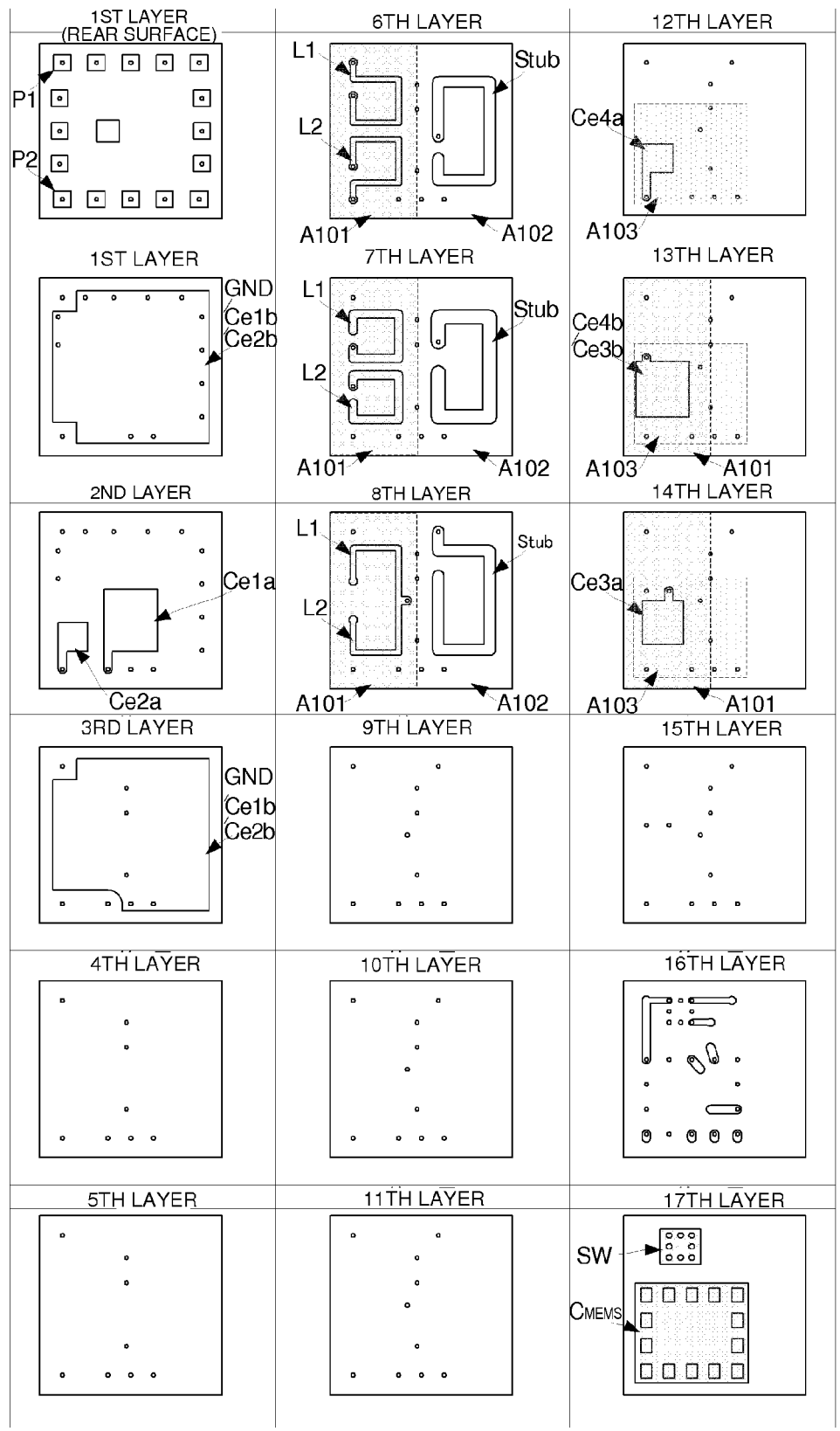
FIG. 2 is a lamination diagram of the matching circuit module 1 according to a preferred embodiment of the present invention.

Next, the mechanical configuration of the matching circuit module of the present preferred embodiment will be described with reference to FIG. 2. In addition, FIG. 2 is the lamination diagram of the matching circuit module 1 of the present preferred embodiment. In FIG. 2, it is assumed that a lowermost layer is a first layer and an uppermost layer is a 17th layer, and a form is described in which a layer number increases from a lower layer side. In addition, symbols ○ in individual layers in FIG. 2 indicate via holes, and conductively connect electrode patterns provided on individual insulation layers to one another in a laminating direction.

As illustrated in FIG. 2, the matching circuit module 1 preferably includes a laminated substrate including 17 layers, for example. On the rear surface of the first layer of the laminated substrate 1, i.e., the mounting surface of the matching circuit module 1, lands for mounting the matching circuit module 1 are provided. On the rear surface of the first layer, lands corresponding to the first input-output port P1 and the second input-output port P2 are also provided.

On the front surface of the first layer, a ground electrode GND is provided on substantially the entire surface that does not overlap with the lands defining the first input-output port P1 and the second input-output port P2 when being viewed in the laminating direction. The ground electrode GND also functions as one electrode Ce1b defining a facing electrode of the fixed capacitance element Ce1 and one electrode Ce2b defining a facing electrode of the fixed capacitance element Ce2.

On the front surface of the second layer, the other electrode Ce1a defining a facing electrode of the fixed capacitance element Ce1 and the other electrode Ce2a defining a facing electrode of the fixed capacitance element Ce2 are defined by a flat-plate electrode pattern having a predetermined shape.

On the front surface of the third layer, the ground electrode GND is provided and preferably has the same or substantially the same shape as the first layer front surface. The ground electrode GND also functions as one electrode Ce1b defining a facing electrode of the fixed capacitance element Ce1 and one electrode Ce2b defining a facing electrode of the fixed capacitance element Ce2.

Using the first layer to the third layer in this manner, the fixed capacitance elements Ce1 and Ce2 are provided.

In the fourth layer and the fifth layer, only via holes are provided. Accordingly, the formation area of the fixed capacitance elements Ce1 and Ce2 and the formation area of the inductors L1 and L2 and the open stub Stub, subsequently illustrated, are arranged so as to be separated by two layers in the laminating direction.

When viewed in the laminating direction, each of the sixth layer to the eighth layer is separated into two areas by via holes connected to the ground electrodes, and line electrode patterns defining the inductors L1 and L2 are provided in a first area A101. In addition, a line electrode pattern defining the open stub Stub is provided in a second area A102. More specifically, the line electrode pattern of the inductors L1 and L2 and the line electrode pattern of the open stub Stub are arranged so as not to overlap each other when viewed in the laminating direction. In this manner, the open stub Stub and the inductors L1 and L2 are arranged so as to be separated into the first area A101 and the second area A102, and the isolation of the open stub Stub and the inductor L1 and L2 is improved. In addition, by being separated using via holes connected to the ground electrodes, it is possible to further improve the isolation characteristic. Furthermore, the line electrode pattern of the inductor L1 and the line electrode pattern of the inductor L2 are also arranged so as not to overlap with each other when viewed in the laminating direction.

In addition, the line electrode pattern of the open stub Stub is preferably configured so as to be wider than the line electrode pattern of the inductors L1 and L2.

In the ninth layer, the 10th layer, and the 11th layer, only via holes are provided. Accordingly, the formation area of the inductors L1 and L2 and the open stub Stub and the formation area of the fixed capacitance elements Ce3 and Ce4 subsequently illustrated are separated from each other by three layers in the laminating direction.

In the first area A101 in the 12th layer, one electrode Ce4a of a facing electrode of the fixed capacitance element Ce4 is defined by a flat-plate electrode pattern having a predetermined shape. At this time, one electrode Ce4a of the fixed capacitance element Ce4 is provided so as to be disposed in a third area A103 that is the same mounting area as that of an MEMS element in the 17th layer, the 17th layer being the uppermost layer when viewed in the laminating direction.

In the third area A103 disposed in the first area A101 in the 13th layer, the other electrode Ce4b of a facing electrode of the fixed capacitance element Ce4 is defined by a flat-plate electrode pattern having a predetermined shape. The other electrode Ce4b of the fixed capacitance element Ce4 also functions as one electrode Ce3b of a facing electrode of the fixed capacitance element Ce3.

In the third area A103 disposed in the first area A101 in the 14th layer, the other electrode Ce3a of a facing electrode of the fixed capacitance element Ce3 is defined by a flat-plate electrode pattern having a predetermined shape.

Only via holes are provided in the 15th layer, and only via holes and a drawing electrode pattern are provided in the 16th layer.

On the front surface of the 17th layer, that is, on the top surface of the laminated substrate of the matching circuit module 1, land electrodes on which a switch element SW and an MEMS element $C_{MEMS}$ that include the variable capacitance elements Cv1 to Cv4 are mounted are provided, and the switch element SW and the MEMS element $C_{MEMS}$ are mounted on individual lands corresponding thereto.

In this manner, using the configuration of the present preferred embodiment, the inductors L1 and L2, the stub Stub, and the fixed capacitance elements Ce1 to Ce4 are preferably provided by the electrodes disposed within the laminated substrate, and the variable capacitance elements Cv1 to Cv4 are preferably provided by the MEMS element that is mounted on the laminated substrate.

Next, the variable capacitance circuit that is included in the matching circuit module of the present preferred embodiment will be described.

The variable capacitance circuits 11 and 12 are preferably arranged to series-connect the fixed capacitance elements to the variable capacitance elements, and to connect in parallel the fixed capacitance elements to the corresponding serial connection circuits. Therefore, while these variable capacitance circuits are simply configured using only the variable capacitance element Cv3 and the variable capacitance element Cv4, it is possible to achieve a wide variety of capacitance ranges.

For example, by denoting the symbols of individual capacitance elements as the individual capacitances thereof, the combined capacitance Ct11 of the variable capacitance circuit 11 is obtained by the following expression.

$$Ct11 = \frac{Cv3}{1 + \frac{Cv3}{Ce1}} + Ce2 \qquad \text{Expression 2}$$

The combined capacitance of the variable capacitance circuit 11 is set as described above. Accordingly, by arbitrarily setting the capacitance of the fixed capacitance element Ce2, it is possible to set the maximum capacitance of the combined capacitance of the variable capacitance circuit 11. In addition, by arbitrarily setting the capacitance of the fixed capacitance element Ce1, it is possible to set the capacitance step size ΔC of the variable capacitance circuit 11. At this time, even if the value of the variable capacitance element Cv3 and the step size thereof are not changed, it is possible to set a step size that is different from the capacitance step size ΔC of only the variable capacitance element Cv3.

In addition, the combined capacitance Ct12 of the variable capacitance circuit 12 is calculated using the following expression.

$$Ct12 = \frac{Cv4}{1 + \frac{Cv4}{Ce3}} + Ce4 \qquad \text{Expression 3}$$

The combined capacitance of the variable capacitance circuit 12 is set as described above. Accordingly, by arbitrarily setting the capacitance of the fixed capacitance element Ce4, it is possible to set the maximum capacitance of the combined capacitance of the variable capacitance circuit 12. In addition, by arbitrarily setting the capacitance of the fixed capacitance element Ce3, it is possible to set the capacitance step size ΔC of the variable capacitance circuit 11. At this time, even if the value of the variable capacitance element Cv4 and the step size thereof are not changed, it is possible to set a step size that is different from the capacitance step size ΔC of only the variable capacitance element Cv4.

For example, FIGS. 3A to 3F are diagrams illustrating characteristics of the combined capacitance Ct and the step size ΔC of a capacitance in a variable capacitance circuit, due to various combinations of a variable capacitance element Cv, a series fixed capacitance element Cse series-connected to the corresponding variable capacitance element Cv, and a parallel fixed capacitance element Csh in parallel with a series circuit based on these variable capacitance element Cv and series fixed capacitance element Cse, and all of the units thereof are [pF]. In FIGS. 3A to 3F, the variable capacitance element Cv is preferably set to a characteristic such that capacitance varies from about 0.5 pF to about 5.0 pF in steps of about 0.5 pF, for example.

In FIG. 3A, the capacitance of the series fixed capacitance element Cse is about 10 pF, and the parallel fixed capacitance element Csh is about 6.67 pF, for example. By performing such a capacitance setting as described above, as illustrated in FIG. 3A, the combined capacitance Ct as the variable capacitance circuit varies between about 7.15 pF and about 10.00 pF, and it is possible to set the capacitance step size ΔC at between about 0.43 pF and about 0.23 pF, for example. Accordingly, it is possible to set a capacitance range different from capacitance that can be simply realized using only the variable capacitance element Cv.

In FIG. 3B, the capacitance of the series fixed capacitance element Cse is about 20 pF, and the parallel fixed capacitance element Csh is about 6 pF, for example. By performing such a capacitance setting as described above, as illustrated in FIG. 3B, the combined capacitance Ct as the variable capacitance circuit varies between about 6.49 pF and about 10.00 pF, and it is possible to set the capacitance step size ΔC at between about 0.46 pF and about 0.33 pF, for example. Accordingly, it is possible to make the capacitance step size ΔC wider than the setting illustrated in FIG. 3A, and it is possible to widen the settable capacitance range by about 0.5 pF.

In addition, in FIG. 3C, the capacitance of the series fixed capacitance element Cse is about 40 pF, and the parallel fixed capacitance element Csh is about 5.45 pF, for example. By performing such a capacitance setting as described above, as illustrated in FIG. 3C, the combined capacitance Ct as the variable capacitance circuit varies between about 5.94 pF and about 9.89 pF, and it is possible to set the capacitance step size ΔC at between about 0.48 pF and about 0.40 pF, for example. Accordingly, it is possible to make the capacitance step size ΔC wider than the setting illustrated in FIG. 3B, and it is possible to make the settable capacitance range about 0.5 pF wider than FIG. 3B.

In addition, in FIG. 3D, the capacitance of the series fixed capacitance element Cse is about 100 pF, and the parallel fixed capacitance element Csh is about 5.24 pF, for example. By performing such a capacitance setting as described above, as illustrated in FIG. 3D, the combined capacitance Ct as the variable capacitance circuit varies between about 5.74 pF and about 10.00 pF, and it is possible to set the capacitance step size ΔC at between about 0.49 pF and about 0.46 pF, for example. Accordingly, it is possible to achieve almost the same capacitance range as the setting illustrated in FIG. 3C, and it is possible to maintain the capacitance step size ΔC nearly constant.

In addition, in FIG. 3E, the capacitance of the series fixed capacitance element Cse is about 40 pF, and the parallel fixed capacitance element Csh is about 15.56 pF, for example. By performing such a capacitance setting as described above, as illustrated in FIG. 3E, the combined capacitance Ct as the variable capacitance circuit varies between about 16.05 pF and about 20.00 pF, and it is possible to set the capacitance step size ΔC at between about 0.48 pF and about 0.40 pF, for example. Accordingly, it is possible to achieve the same or substantially the same capacitance range as the setting illustrated in FIG. 3C, and it is possible to achieve another capacitance range that does not overlap with the capacitance range illustrated in FIG. 3C.

In addition, in FIG. 3F, the capacitance of the series fixed capacitance element Cse is about 1 pF, and the parallel fixed capacitance element Csh is about 1.17 pF, for example. By performing such a capacitance setting as described above, as illustrated in FIG. 3F, the combined capacitance Ct as the variable capacitance circuit varies between about 1.50 pF and about 2.00 pF, and it is possible to set the capacitance step size ΔC at between about 0.17 pF and about 0.02 pF. Accordingly, it is possible to achieve a low capacitance range that is difficult to achieve with only the variable capacitance element Cv or using the capacitance ranges illustrated in FIGS. 3A to 3E. Furthermore, it is possible to achieve a capacitance step size ΔC that is shorter than with only the variable capacitance element Cv and those illustrated in FIGS. 3A to 3E.

As described above, by using the configuration of the present preferred embodiment, without replacing a variable capacitance element, it is possible to achieve a wide variety of capacitance ranges and step sizes ΔC of capacitance, as compared to a case in which a simple variable capacitance element is independently used.

Here, if such a wide variety of capacitance ranges and step sizes ΔC of capacitance are achieved using a variable capacitance element group including an MEMS element, the number of variable capacitance elements greatly increases. Therefore, the size of the MEMS element is greatly increased, thereby greatly increasing the cost.

However, according to the configuration of the present preferred embodiment, as described above, a wide variety of capacitance ranges and step sizes ΔC of capacitance are achieved by the combinations of the fixed capacitance elements and the variable capacitance elements. In addition, as illustrated in FIG. 2 described above, the fixed capacitance element is defined by the inner-layer flat-plate electrode provided within the laminated substrate, and thus, it is possible to inexpensively provide the fixed capacitance element portion of the variable capacitance circuit with a simple configuration. Accordingly, as compared to a case in which a variable capacitance circuit (variable capacitance module) is defined by the variable capacitance element group including an MEMS element, it is possible to provide a variable capacitance circuit with a small size and a low price.

In addition, at this time, as illustrated in the 12th layer to the 17th layer in FIG. 2 described above, the mounting area of the MEMS element within which the variable capacitance element Cv4 is packaged and the formation area of the fixed capacitance elements Ce3 and Ce4 overlap with each other when viewed in the laminating direction, and thus, the connection lines between the variable capacitance element Cv4 and the fixed capacitance elements Ce3 and Ce4 of the variable capacitance circuit 12 are preferably provided only in the laminating direction. Therefore, the variable capacitance circuit 12 preferably includes extremely short connection lines. Accordingly, it is possible to greatly reduce the coupling of the connection lines to another circuit element or an electrode, and it is possible to reduce an area when viewed in the laminating direction. As a result, it is possible to provide a small-sized variable capacitance circuit (variable capacitance module) capable of achieving desired capacitances with a high degree of accuracy.

Furthermore, in this variable capacitance circuit 12, one of the facing electrodes of each of the fixed capacitance elements Ce3 and Ce4 is preferably shared by the fixed capacitance elements Ce3 and Ce4. Therefore, a connection line between the fixed capacitance elements Ce3 and Ce4 is not required so as to provide a variable capacitance module with a high degree of accuracy and a small size.

Next, the characteristics of a variable matching circuit module including a variable capacitance circuit (variable capacitance module) according to a preferred embodiment of the present invention will be described.

When the capacitances of the variable capacitance circuits 11 and 12, the inductances of the individual inductors L1 and L2, the variable capacitance elements Cv1 and Cv2, and the capacitances of the variable capacitance circuits 11 and 12 are arbitrarily set, the LC circuit network 10 can achieve an impedance in which a desired matching characteristic can be obtained. At this time, not only the variable capacitance elements Cv1 to Cv4 but also the variable capacitance circuits 11 and 12 as described above are used, thereby achieving a wider variety of impedance-matching ranges.

Here, since the variable capacitance circuits 11 and 12 included in the LC circuit network 10 are preferably defined by electrodes packaged within the laminated substrate and the MEMS element mounted in the laminated substrate, as described above, the characteristics of the variable capacitance circuits 11 and 12 are improved as compared to a case in which the variable capacitance circuits 11 and 12 are individually provided and connected to one another, and the size of the variable capacitance circuits 11 and 12 can be significantly reduced.

Furthermore, in the matching circuit module 1 of the present preferred embodiment, the open stub Stub is preferably connected on the first input-output port P1 side of the LC circuit network 10 through the switch element SW, and thus, an impedance-matching range can be greatly changed by changing the configuration of the open stub Stub.

Figure 4A:
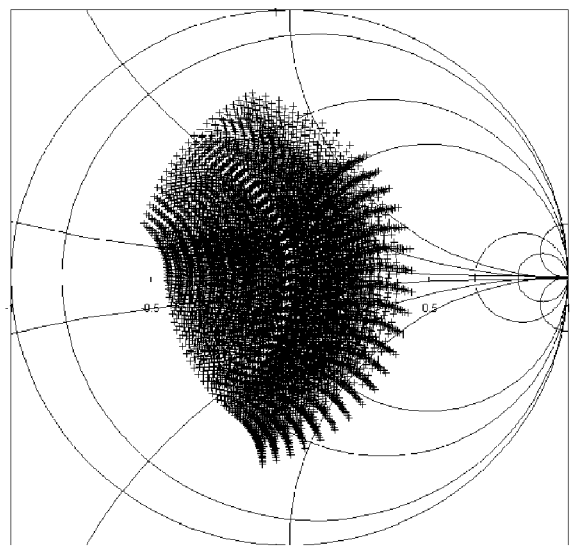
FIGS. 4A to 4C are diagrams illustrating the change of an impedance-matching range due to the presence or absence of the connection of an open stub and the change of the length of the open stub.
Figure 4B:
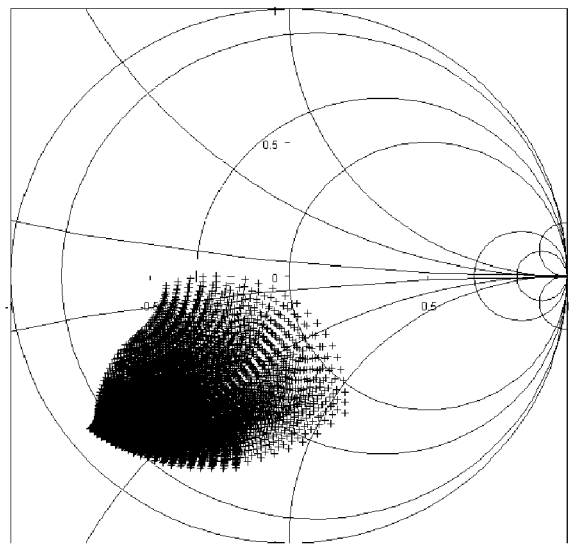
Figure 4C:
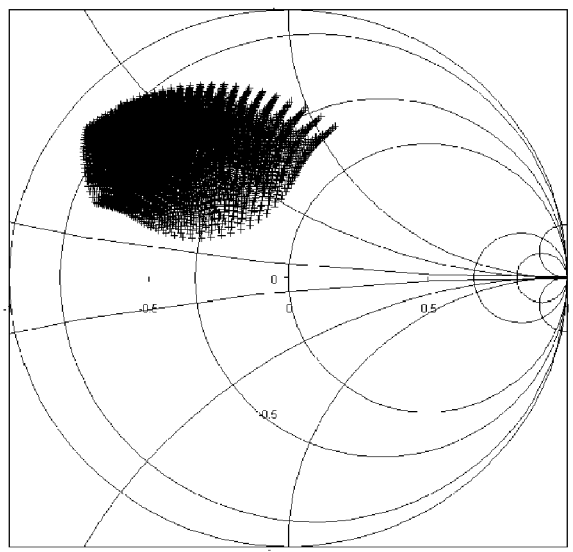

FIGS. 4A to 4C are diagrams illustrating the change of an impedance-matching range due to the presence or absence of the connection of the open stub Stub and the change of the length of the open stub Stub, at the frequency of about 1 GHz. In FIGS. 4A to 4C, a range indicated by a group including symbols x on a Smith chart indicates a range in which impedance matching can be performed. FIG. 4A illustrates a case in which the open stub Stub is not connected, FIG. 4B illustrates a case in which the open stub Stub having a length of about 100 mm is connected, and FIG. 4C illustrates a case in which the open stub Stub having a length of about 200 mm is connected.

As illustrated in FIGS. 4A to 4C, depending on whether or not the open stub Stub is connected, the range in which impedance matching can be performed significantly varies. Furthermore, depending on the line length of the connected open stub Stub, the range in which impedance matching can be performed also significantly varies.

By connecting the open stub Stub as described above, it is possible to achieve an impedance-matching range that is different from the LC circuit network 10. Furthermore, by arbitrarily adjusting the electrical length of the connected open stub Stub, it is possible to achieve an impedance-matching range that varies depending on the line length. Accordingly, it is possible to achieve a wider variety of impedance-matching ranges. At this time, since the open stub Stub is preferably defined by a line electrode within the laminated substrate, a simple structure is obtained. Since the open stub Stub is provided in a plurality of layers, the electrical length can be adjusted merely by changing the number of layers in which line electrode patterns are provided. Therefore, it is possible to provide various electrical lengths of the open stub Stub without changing the size when viewed in the laminating direction. Accordingly, it is possible to provide a small-sized matching circuit module capable of achieving a wide variety of impedance-matching ranges.

Furthermore, by controlling the connection and non-connection of the open stub Stub using the switch element SW, when, for example, the open stub Stub whose line length is about 100 mm illustrated in FIG. 4B is used, it is possible to achieve the impedance-matching range illustrated in FIG. 4A and the impedance-matching range illustrated in FIG. 4B, by switching the switch element SW. Accordingly, a matching circuit module having a wider variety of and broader impedance-matching ranges is provided. At this time, since the switch element SW is mounted on the laminated substrate, a size of the substrate when viewed in the laminating direction does not depend on the presence or absence of the switch element SW. Accordingly, a matching circuit module having a wide variety of and broader impedance-matching ranges is obtained without increasing the size thereof.

In addition, when switching is performed, the electrical length is preferably set so that impedance-matching ranges individually obtained based on the connection and non-connection of the open stub Stub do not overlap with each other. Therefore, an even broader impedance-matching range can be achieved.

As described above, the line electrode pattern of the inductors L1 and L2 of the LC circuit network 10 and the line electrode pattern of the open stub Stub are preferably arranged in different areas when viewed in the laminating direction, so as not to overlap with each other when viewed in the laminating direction. Therefore, coupling between the inductors L1 and L2 and the open stub Stub is effectively prevented or minimized. Accordingly, the inductances of the inductors L1 and L2 and the open stub Stub are achieved with a high degree of accuracy so that the inductances having desired values are obtained. As a result, a matching circuit module having a high-precision impedance matching characteristic is obtained.

Furthermore, as illustrated in the 6th layer to the 14th layer, the open stub Stub and each of the fixed capacitance elements Ce3 and Ce4 are preferably arranged in different areas when viewed in the laminating direction, so as not to overlap with each other when viewed in the laminating direction. Therefore, coupling between the fixed capacitance elements Ce3 and Ce4 and the open stub Stub is effectively reduced. As a result, a matching circuit module having a high-precision impedance matching characteristic is obtained.

As described above, with the configuration of the present preferred embodiment, it is possible to inexpensively provide a small-sized matching circuit module that is capable of achieving a wider variety of and broader impedance-matching ranges.

Figure 5A:
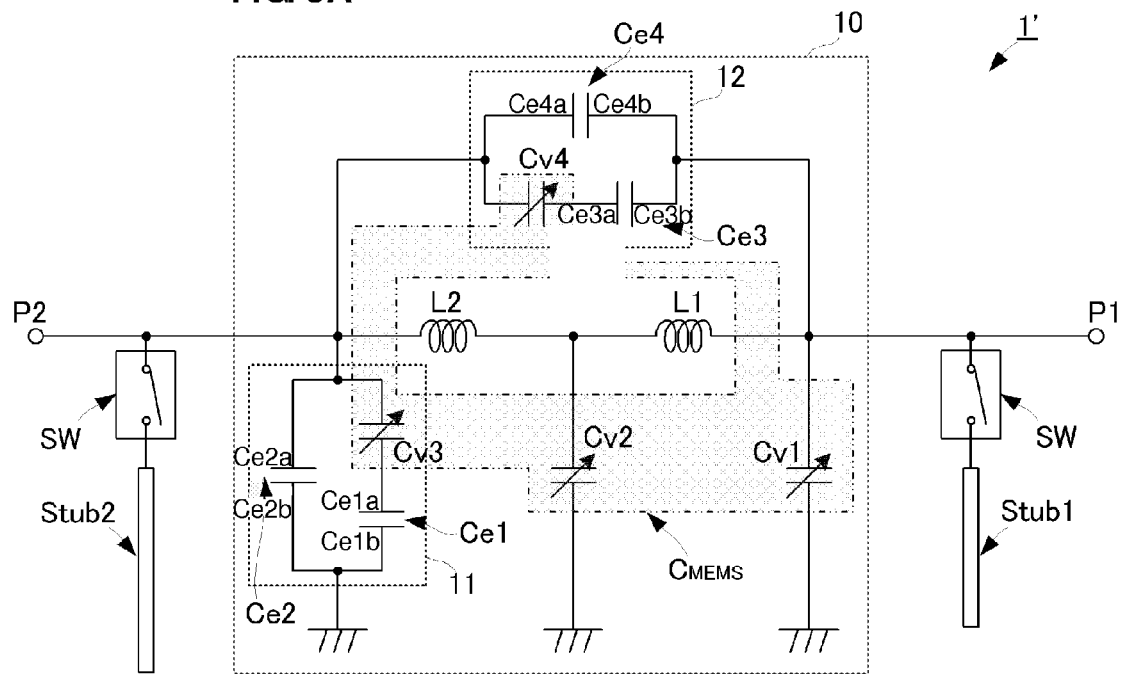
FIGS. 5A and 5B are block diagrams illustrating variations of the open stub Stub.
Figure 5B:
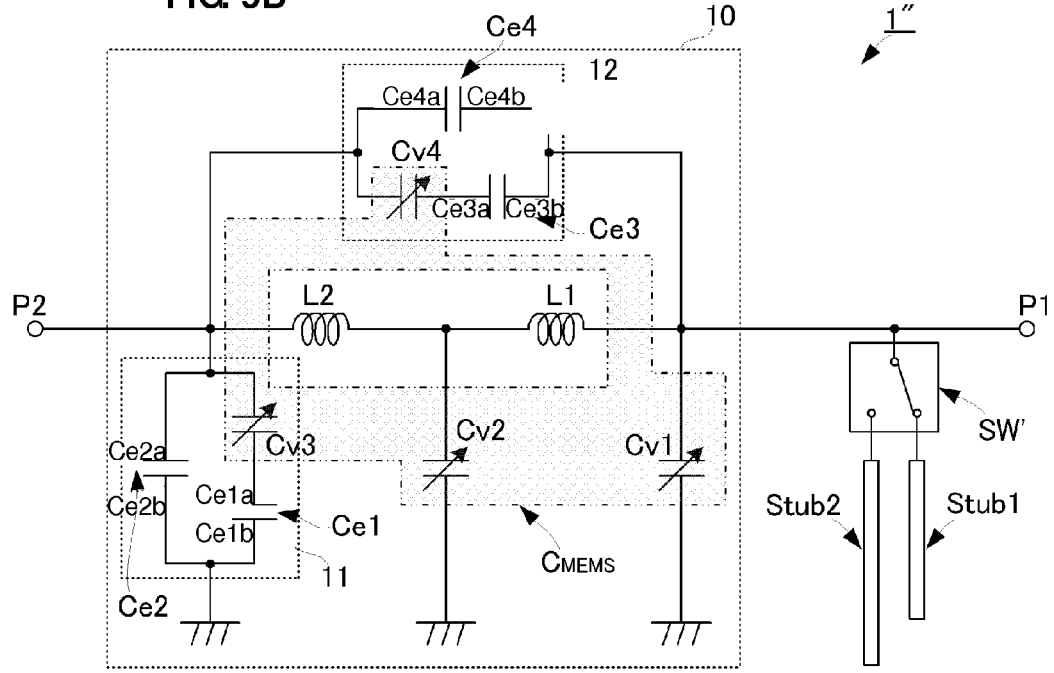
Figure 6A:
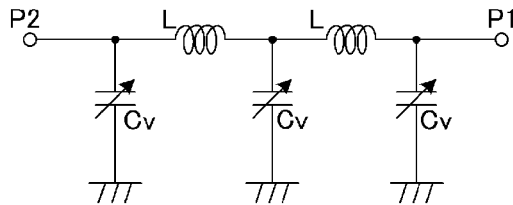
FIGS. 6A to 6H are circuit diagrams illustrating variations of an LC circuit network.
Figure 6D:
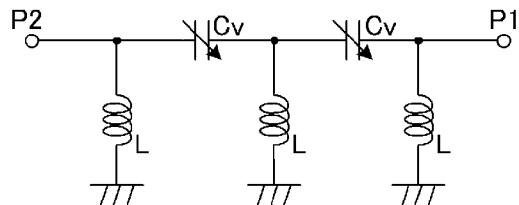
Figure 6B:
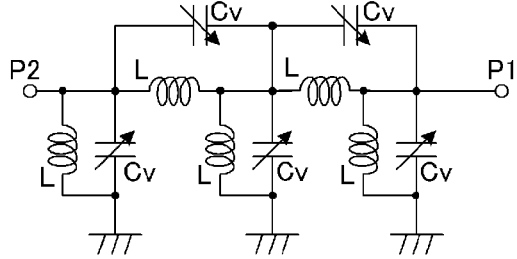
Figure 6E:
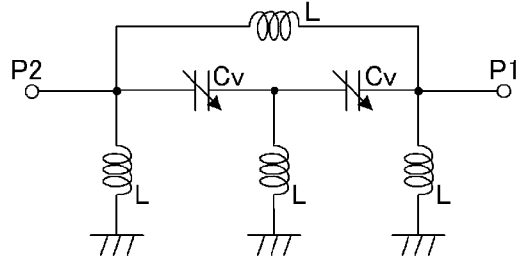
Figure 6C:
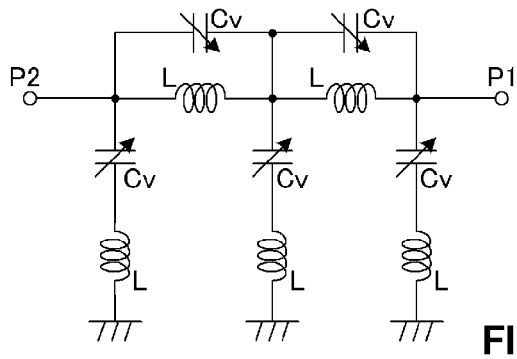
Figure 6F:
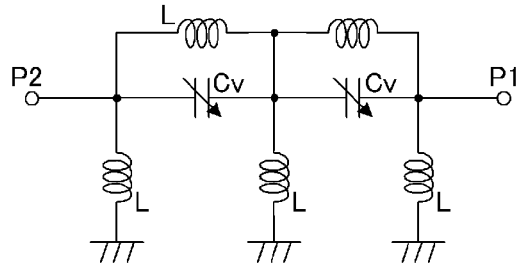
Figure 6G:
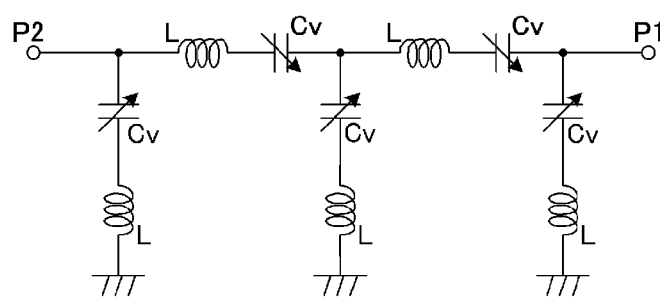
Figure 6H:
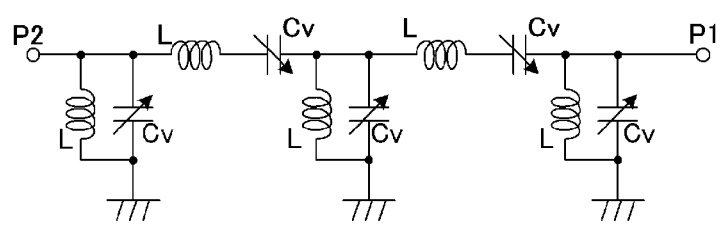

In addition, while, in the above-mentioned preferred embodiment, an example has been illustrated in which one of the open stubs Stub is preferably provided, according to another preferred embodiment of the present invention, a plurality of open stubs Stub may also be provided as illustrated in FIGS. 5A and 5B. FIGS. 5A and 5B are block diagrams illustrating variations of the open stub Stub.

For example, in the configuration of a matching circuit module 1' according to another preferred embodiment of the present invention as illustrated in FIG. 5A, an open stub Stub1 is preferably connected on the first input-output port P1 side of the LC circuit network 10 through the switch element SW, and an open stub Stub2 is preferably connected on the second input-output port P2 side thereof. The electrical lengths of these open stubs Stub1 and Stub2 may be identical to or different from each other, and may be arbitrarily set in accordance with a desired impedance-matching range. In addition, by setting the electrical lengths of the open stubs Stub1 and Stub2 to be different from each other, it is possible to achieve an even broader impedance-matching range using the two switches SW.

In addition, in the configuration of a matching circuit module 1" according to another preferred embodiment of the present invention as illustrated in FIG. 5B, by toggling between the open stub Stubs 1 and 2 whose electrical lengths are different from each other using a switch element SW on the first input-output port P1 side of the LC circuit network 10, it is possible to realize impedance-matching ranges that are different from each other, respectively. Even in such a configuration, it is possible to achieve an even broader impedance-matching range. In addition, the number of the open stubs Stub is not limited to one or two, and the number of the open stubs Stub may also be greater than or equal to three. Furthermore, the configuration illustrated in FIG. 5A and the configuration illustrated in FIG. 5B may preferably be combined with each other.

In addition, while, in the description of the above-mentioned preferred embodiment, a case has been illustrated in which the variable capacitance elements Cv1 and Cv2 preferably are independently provided and the variable capacitance elements Cv3 and Cv4 are defined by the variable capacitance circuits 11 and 12 (variable capacitance modules), all of the variable capacitance elements may also be defined by variable capacitance circuits. Accordingly, it is possible to achieve a wider variety of capacitance, and in response to this, it is possible to achieve a wide variety of impedance-matching ranges.

In addition, while, in the description of the above-mentioned preferred embodiment, a case has been illustrated in which the fixed capacitance elements Ce1 to Ce4 of the variable capacitance circuits 11 and 12 are preferably defined by the inner-layer flat-plate electrodes in the laminated substrate, the fixed capacitance elements Ce1 to Ce4 may also be defined discrete components mounted on the laminated substrate, so as to obtain a desired capacitance.

In addition, the LC circuit network 10 is an example for achieving a desired impedance-matching range, and as illustrated in FIGS. 6A to 6H, it is possible to provide various circuit configurations defined by different combinations of inductors, variable capacitance circuits, and variable capacitance elements. FIGS. 6A to 6H are circuit diagrams illustrating variations of an LC circuit network. In addition, while, in FIGS. 6A to 6H, all of the inductors are indicated by circuit symbols L, and all of the variable capacitance elements are indicated by circuit symbols Cv, each of the element values thereof may be arbitrarily set in response to a desired characteristic. In addition, all of the circuit symbols indicating the variable capacitance elements Cv in the drawing may be the above-mentioned variable capacitance circuit, and the variable capacitance circuit and an independent variable capacitance element may also be arbitrarily combined with each other.

As illustrated in FIGS. 6A to 6H, by arbitrarily combining the inductors, the variable capacitance circuits, and the variable capacitance elements with one another, it is possible to set a wider variety of desired impedance-matching ranges.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A variable capacitance module comprising:
    a laminate substrate;
    a variable capacitance element defined by a MEMS element including a predetermined variable capacitance width, and the variable capacitance element is arranged to enable a capacitance of the variable capacitance element to be set to different values that incrementally increase in at least three steps within the variable capacitance width;
    a first fixed capacitance element connected in series to the variable capacitance element so as to define a series circuit, and mounted in the laminated substrate in which the variable capacitance element is mounted or defined by an inner-layer flat-plate electrode in the laminated substrate; and
    a second fixed capacitance element connected in parallel to the series circuit of the variable capacitance element and the first fixed capacitance element, and mounted in the laminated substrate in which the variable capacitance element is mounted or defined by an inner-layer flat-plate electrode in the laminated substrate; wherein
    the variable capacitance width of the variable capacitance element is fixed;
    the second fixed capacitance element is set to a capacitance value based on a desired variable capacitance range of the variable capacitance module; and
    the first fixed capacitance element is set to a capacitance value determining a desired variable capacitance pitch of the variable capacitance module.

2. The variable capacitance module according to claim 1, wherein
    both of the first fixed capacitance element and the second fixed capacitance element are defined by the inner-layer flat-plate electrode and include an inner-layer flat-plate electrode that is shared by both of the first fixed capacitance element and the second fixed capacitance element.

3. The variable capacitance module according to claim 2, wherein
    the first fixed capacitance element and the second fixed capacitance element are disposed in a lower layer of an area of the laminated substrate in which the variable capacitance element is mounted.

4. A matching circuit module comprising:
    the variable capacitance module of claim 1; and
    an inductor provided in the laminated substrate; wherein
    an LC circuit network is defined by the variable capacitance module and the inductor being connected to each other by an electrode pattern provided in the laminated substrate.

5. The matching circuit module according to claim 4, further comprising:
    an open stub connected to the LC circuit network and defined by a stub-use electrode provided in the laminated substrate.

6. The matching circuit module according to claim 5, wherein
    the open stub includes a plurality of open stubs having electrode lengths that are different from one another.

7. The matching circuit module according to claim 5, wherein
    the stub-use electrode and the inner-layer flat-plate electrode defining the first fixed capacitance element and the second fixed capacitance element are arranged so as not to overlap each other when the laminated substrate is viewed in a plan view.

8. The matching circuit module according to claim 5, wherein
    the inductor is defined by an inductor-use electrode provided in the laminated substrate; and
    the inductor-use electrode and the stub-use electrode are arranged so as not to overlap each other when the laminated substrate is viewed in a plan view.

9. The matching circuit module according to claim 5, wherein
    a switch element is provided between the LC circuit network and the open stub.

10. The matching circuit module according to claim 9, wherein
    an electrode length of the stub-use electrode is set so that impedance matching ranges switched by the open stub do not overlap with each other.

* * * * *